United States Patent
Chen

(10) Patent No.: US 10,288,913 B2
(45) Date of Patent: May 14, 2019

(54) DISPLAY PANEL

(71) Applicants: HKC Corporation Limited, Shenzhen (CN); Chongqing HKC Optoelectronics Technology Co., ltd., Chongqing (CN)

(72) Inventor: Yu-Jen Chen, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/855,714

(22) Filed: Dec. 27, 2017

(65) Prior Publication Data

US 2018/0307066 A1 Oct. 25, 2018

Related U.S. Application Data

(63) Continuation of application No. PCT/CN2017/106314, filed on Oct. 16, 2017.

(30) Foreign Application Priority Data

Apr. 19, 2017 (CN) .......................... 2017 1 0256311

(51) Int. Cl.
| | | |
|---|---|---|
| *G02F 1/13* | (2006.01) | |
| *H01L 27/00* | (2006.01) | |
| *G01R 31/44* | (2006.01) | |
| *G02F 1/1345* | (2006.01) | |
| *G02F 1/1362* | (2006.01) | |
| *G01R 1/20* | (2006.01) | |
| *H01L 21/66* | (2006.01) | |

(Continued)

(52) U.S. Cl.
CPC ........... *G02F 1/1309* (2013.01); *G01R 1/206* (2013.01); *G01R 31/44* (2013.01); *G02F 1/13452* (2013.01); *G02F 1/133308* (2013.01); *G02F 1/136286* (2013.01); *H01L 22/34* (2013.01); *H01L 27/124* (2013.01)

(58) Field of Classification Search
CPC ............ G02F 1/1309; G02F 1/133308; G02F 1/13452; G02F 1/136286; G01R 1/206; G01R 31/44; H01L 22/34; H01L 27/124
See application file for complete search history.

(56) References Cited

U.S. PATENT DOCUMENTS 7,777,854 B2 * 8/2010 Moon .................. G02F 1/1345
    345/104
9,000,796 B2 * 4/2015 Shirouzu ........... G02F 1/136204
    324/760.02

(Continued)

*Primary Examiner* — Nikolay K Yushin
(74) *Attorney, Agent, or Firm* — WPAT, PC

(57) ABSTRACT

A display panel is provided. The display panel includes a cell test structure. The cell test structure is positioned at a frame of the display panel. The cell test structure includes cell test portions for supplying electric power to the cell test structure, and multiple connection lines for connecting conductive lines of a display region of the display panel. The cell test structure also includes a first shorting bar disposed and connected between the cell test portions and the connection lines. The cell test structure further includes multiple active switches disposed on the connection lines. The active switches are electrically connected to the cell test portions.

20 Claims, 2 Drawing Sheets

(51) Int. Cl.
*H01L 27/12* (2006.01)
*G02F 1/1333* (2006.01)

(56) References Cited

U.S. PATENT DOCUMENTS

| 9,595,213 B2* | 3/2017 | Kim | G09G 3/006 |
| 2004/0119925 A1* | 6/2004 | Moon | G02F 1/1345 349/139 |
| 2012/0056186 A1* | 3/2012 | Shirouzu | G02F 1/136204 257/59 |
| 2014/0354286 A1* | 12/2014 | Kim | G09G 3/006 324/414 |

* cited by examiner

DISPLAY PANEL

FIELD OF THE DISCLOSURE

The disclosure relates to a display technical field, and more specifically to a display panel.

BACKGROUND

Liquid crystal displays are widely applied due to numerous advantages such as thin bodies, energy saving, radiation-free, etc. Most liquid crystal displays available on the market are backlight-type liquid crystal displays, and such liquid crystal display includes a liquid crystal panel and a backlight module. The working principle of the liquid crystal panel is placing liquid crystal molecules between two parallel glass substrates and loading a driving voltage on the two glass substrates to control rotation directions of the liquid crystal molecules, for refracting rays of the backlight module to generate images.

Thin Film Transistor-Liquid Crystal Display (TFT-LCD) has gradually dominated the display realm at present because of its properties such as low energy consumption, superior image quality and high production yield, etc. Similarly, the TFT-LCD includes a liquid crystal panel and a backlight module. The liquid crystal panel includes a Color Filter Substrate (CF Substrate, also known as a color filter substrate), a Thin Film Transistor Substrate (TFT Substrate), and a mask. The opposite internal sides of these substrates have transparent electrodes. A layer of Liquid Crystal molecules (LC) is sandwiched between two substrates.

As display devices, such as TFT-LCD, gradually develop to ultra-large size, high driving frequency, high resolution and other aspects, the frame of display panel with large size often affect visual experience when the user is viewing. As a result, visual sensory is poor, and it cannot be improved to good display sense. However, the display panel with a narrow frame often needs more processes to perform the cell test. It is not beneficial for reducing processes and costs.

SUMMARY

The technical problem to be solved by the disclosure is to provide a display panel which reduces process and time.

The objective of the disclosure is achieved by the following technical solutions: a display panel, comprising a cell test structure positioned at a frame of the display panel, wherein the cell test structure comprises:
  cell test portions for supplying electric power to the cell test structure;
  a plurality of connection lines for connecting conductive lines of a display region of the display panel;
  at least one first shorting bar, disposed and connected between the cell test portions and the connection lines;
  a plurality of active switches, disposed on the connection lines, wherein the active switches are electrically connected to the cell test portions.

Wherein the cell test structure comprises an active switch control line intersecting the connection lines, and the active switches are disposed on the active switch control line. No matter the active switches are disposed on multiple connection lines to control the connection of the connection lines or not, disposing the active switch control line intersecting the connection lines at the same time facilitates simultaneous work. Complicated settings for separately control single active switch are simplified. Costs are reduced and it is easier for management at the same time.

Wherein the active switch control line comprises an active switch control portion of the active switches disposed on two ends of the active switch control line. The active switch control portion disposed on two ends can control turn-on and disconnection of the active switches in real-time and effectively by the external input. The input type is various and more suitable.

Wherein the active switch control line is coupled to a driving chip of the display panel. The driving chip is coupled, so turn-on and disconnection of the active switches are controlled by internal signal of the display panel. It is able to use the original electrical components and wiring arrangements, and so on, so as to reduce the structure arrangement of the cell test structure and reduce costs.

Wherein the active switches have a width of 30 μm. The active switches with small width facilitates the use of the cell test structure on the display panel having a narrow frame or even an ultra-narrow frame. It does not take up too much space and facilitates layout.

Wherein the first shorting bar comprises at least two connection portions disposed thereon and connected to the cell test portions. In other words, at least two cell test portions are connected to the first shorting bar. When the cell test structure is used to test the display panel, the testing is usually partitioned. For example, two test regions adjacent to each other in the same direction share the same first shorting bar. Two ends and the middle portion of the first shorting bar comprise three cell test portions disposed thereon. It makes full use of the corresponding structure and optimizes the layout of structure.

Wherein the connection lines are connected to data lines of the display region of the display panel. The frame of the display panel comprises a first conductive line fan-out region of the data lines. Multiple data lines are arranged through the first conductive line fan-out region in a non-parallel form. The distances between the data lines in the first conductive line fan-out region are reduced from the display region of the display panel towards the frame of the display panel. This is an embodiment of the cell testing when the connection lines are connected to the data lines. The data lines in the display region pass through the fan-out region and then are connected to the connection lines.

Wherein the connection lines are connected to scan lines of the display region of the display panel. The frame of the display panel comprises a second conductive line fan-out region of the scan lines. Multiple scan lines are arranged through the second conductive line fan-out region in a non-parallel form. The distances between the scan lines in the second conductive line fan-out region are reduced from the display region of the display panel towards the frame of the display panel. This is an embodiment of the cell testing when the connection lines are connected to the scan lines. The scan lines in the display region pass through the fan-out region and then are connected to the connection lines.

Wherein the active switches are thin film transistors. Thin film transistors (TFT) have a wide range of applications and mature technology, and are easy to use.

Wherein the cell test structure comprises active switch control line intersecting the connection lines. One first shorting bar comprises one cell test portion individually disposed on two ends thereof. The middle portion of the first shorting bar is connected to three connection lines. The three connection lines individually comprise one of the active switches disposed at a corresponding position. The three active switches are disposed on one active switch control line. The active switch control line comprises two active switch control portions of the active switches disposed on two ends thereof. This is an embodiment when the cell testing is partitioned.

In the disclosure, the active switches are disposed on the connection lines. The electrical connection between the active switches and the cell test portions is used to achieve both turn-on and disconnection so as to perform the cell testing on the display panel. The space saving is maximized. The excess processes are deleted. The tact time is reduced.

BRIEF DESCRIPTION OF THE DRAWINGS

The accompanying drawings are provided for further understanding of the embodiments of the disclosure. The drawings form a part of the specification for illustrating embodiments of the disclosure. The drawings and the description are together used to illustrate the principles of the disclosure. It would be apparent that the accompanying drawings in the following description are merely some embodiments of the disclosure. Those skilled in the art may obtain other drawings according to the accompanying drawings without creative efforts. In the drawings.

DETAILED DESCRIPTION OF PREFERRED EMBODIMENTS

Figure 1:
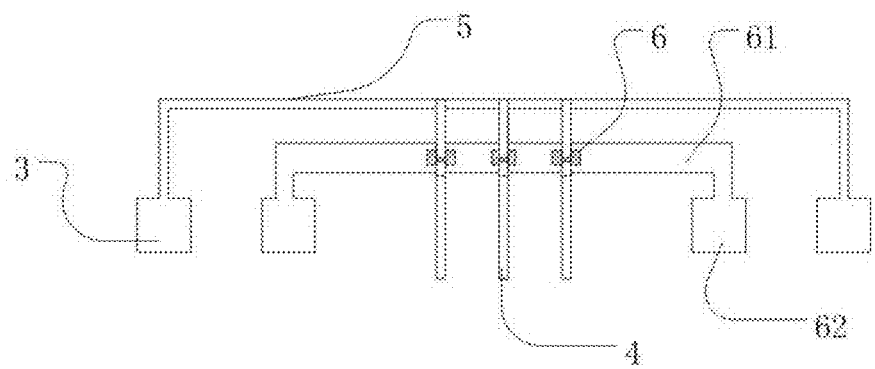
FIG. 1 is a structural schematic view of a cell test structure of a display panel according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings. The terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

In the following, structural schematic views of a display panel according to an embodiment of the disclosure will be described with reference to FIGS. 1 to 3.

Figure 2:
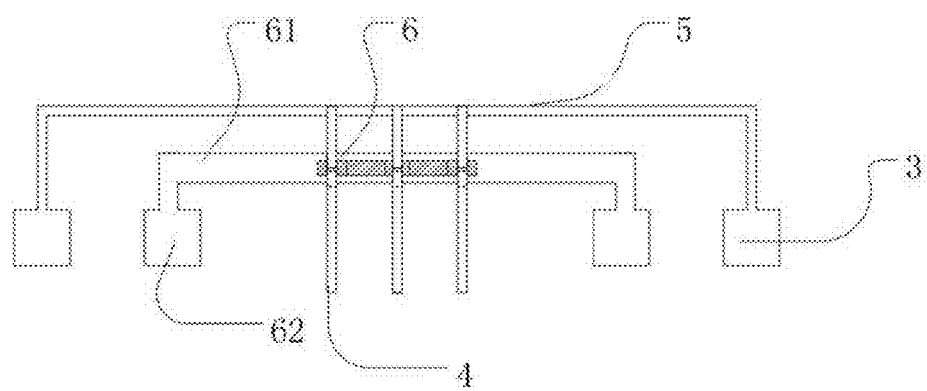
FIG. 2 is a structural schematic view of a cell test structure of a display panel according to an embodiment of the disclosure.
Figure 3:
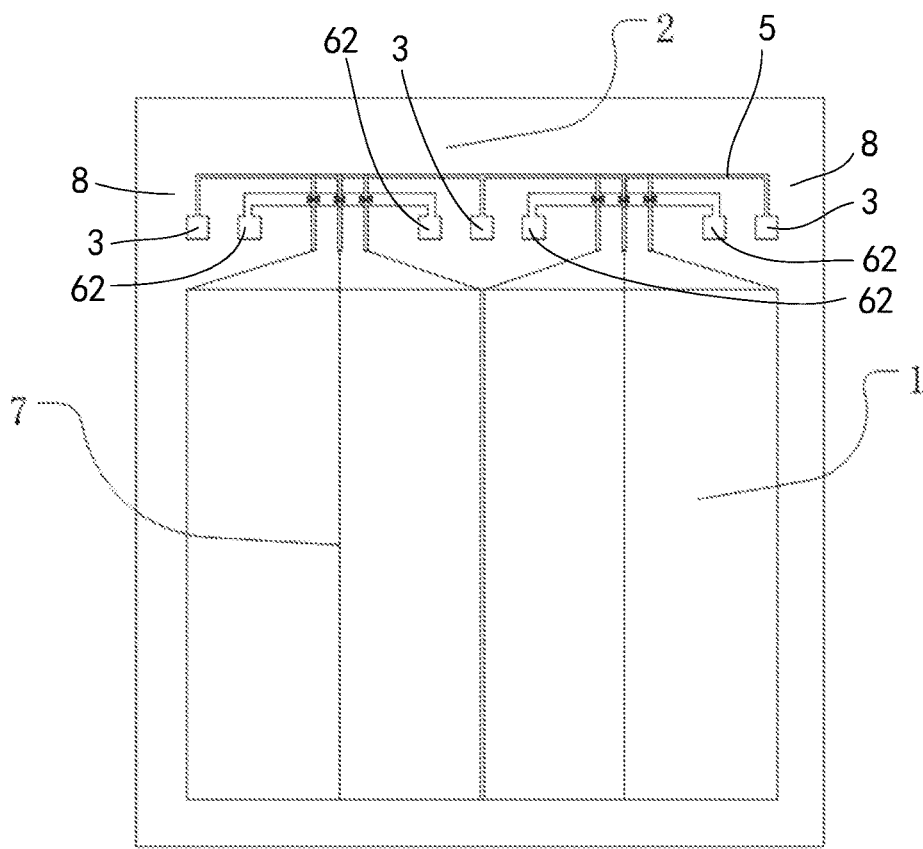
FIG. 3 is a structural schematic view of a display panel according to an embodiment of the disclosure.

As one embodiment of the disclosure, as shown in FIGS. 1-3, the display panel comprises a cell test structure. The cell test structure is positioned at a frame 2 of the display panel. The cell test structure comprises cell test portions 3 for supplying electric power to the cell test structure, and multiple connection lines 4 for connecting conductive lines of a display region 1 of the display panel. The cell test structure also comprises at least one first shorting bar 5. The first shorting bar 5 is disposed and connected between the cell test portions 3 and the connection lines 4. The cell test structure further comprises multiple active switches 6 disposed on the connection lines 4. The active switches 6 are electrically connected to the cell test portions 3. In the disclosure, the active switches 6 are disposed on the connection lines 4. The electrical connection between the active switches 6 and the cell test portions 3 is used to achieve both turn-on and disconnection so as to perform the cell testing on the display panel. The space saving is maximized. The excess processes are deleted. The tact time is reduced.

In this situation, when the cell test structure is turned on, the cell test portions 3 are first supplied with electric power. At the same time, the active switches 6 are at turn-on state through signal connection between the cell test portions 3 and the control terminal of the active switches 6. Electric power is transmitted to the connection lines (lead) 4 through traces of the first shorting bar 5. Electric power is finally transmitted to the conductive lines of the display region 1 so the cell testing of the display panel is finished. When the cell testing is not required, the cell test structure does not work. The cell test portions 3 are not supplied with electric power. The active switches 6, which has signal connection to the cell test portions 3, are not turned on. The shorting bar and the lead are disconnected.

As another embodiment of the disclosure, as shown in FIGS. 1-3, the display panel comprises a cell test structure. The cell test structure is positioned at the frame 2 of the display panel. The cell test structure comprises the cell test portions 3 for supplying electric power to the cell test structure, and multiple connection lines 4 for connecting the conductive lines of the display region 1 of the display panel. The cell test structure also comprises at least one first shorting bar 5. The first shorting bar 5 is disposed and connected between the cell test portions 3 and the connection lines 4. The cell test structure further comprises multiple active switches 6 disposed on the connection lines 4. The active switches 6 are electrically connected to the cell test portions 3. The active switches 6 are disposed on the connection lines 4, and the electrical connection between the active switches 6 and the cell test portions 3 is used to achieve both turn-on and disconnection so as to perform the cell testing on the display panel. The space saving is maximized. The excess processes are deleted. The tact time is reduced. The cell test structure comprises an active switch control line 61 intersecting the connection lines 4. Multiple active switches 6 are disposed on the active switch control line 61. No matter the active switches 6 are disposed on multiple connection lines 4 to control the connection of the connection lines 4 or not, disposing the active switch control line 61 intersecting the connection lines 4 at the same time facilitates simultaneous work. Complicated settings for separately control single active switch 6 are simplified. Costs are reduced and it is easier for management at the same time. The active switch control line 61 is disposed to be perpendicular to the connection lines 4. The active switch control line 61 comprises an active switch control portion 62 of the active switches 6 disposed on two ends thereof. The active switch control portion 62 disposed on two ends can control turn-on and disconnection of the active switches 6 in real-time and effectively by the external input. The input type is various and more suitable. The active switch control portions 62 are pads.

As still another embodiment of the disclosure, as shown in FIGS. 1-3, the display panel comprises a cell test structure. The cell test structure is positioned at the frame 2 of the display panel. The cell test structure comprises the cell test portions 3 for supplying electric power to the cell test structure, and multiple connection lines 4 for connecting the conductive lines of the display region 1 of the display panel. The cell test structure also comprises at least one first shorting bar 5. The first shorting bar 5 is disposed and connected between the cell test portions 3 and the connection lines 4. The cell test structure further comprises multiple active switches 6 disposed on the connection lines 4. The active switches 6 are electrically connected to the cell test portions 3. The active switches 6 are disposed on the connection lines 4, and the electrical connection between the active switches 6 and the cell test portions 3 is used to achieve both turn-on and disconnection so as to perform the cell testing on the display panel. The space saving is maximized. The excess processes are deleted. The tact time is reduced. The cell test structure comprises the active switch control line 61 intersecting the connection lines 4. Multiple active switches 6 are disposed on the active switch control line 61. No matter the active switches 6 are disposed on multiple connection lines 4 to control the connection of the connection lines 4 or not, disposing the active switch control line 61 intersecting the connection lines 4 at the same time facilitates simultaneous work. Complicated settings for separately control single active switch 6 are simplified. Costs are reduced and it is easier for management at the same time. The active switch control line 61 is disposed to be perpendicular to the connection lines 4. The active switch control line 61 is coupled to a driving chip of the display panel. The driving chip is coupled, so turn-on and disconnection of the active switches 6 are controlled by internal signal of the display panel. It is able to use the original electrical components and wiring arrangements, and so on, so as to reduce the structure arrangement of the cell test structure and reduce costs. For example, the active switch control line 61 coupled to the driving chip may comprise one active switch 6 disposed thereon. The operation of the active switches 6 disposed on the connection lines 4 is controlled through this active switch 6.

As even still another embodiment of the disclosure, as shown in FIGS. 1-3, the display panel comprises a cell test structure. The cell test structure is positioned at the frame 2 of the display panel. The cell test structure comprises the cell test portions 3 for supplying electric power to the cell test structure, and multiple connection lines 4 for connecting the conductive lines of the display region 1 of the display panel. The cell test structure also comprises at least one first shorting bar 5. The first shorting bar 5 is disposed and connected between the cell test portions 3 and the connection lines 4. The cell test structure further comprises multiple active switches 6 disposed on the connection lines 4. The active switches 6 are electrically connected to the cell test portions 3. The active switches 6 are disposed on the connection lines 4, and the electrical connection between the active switches 6 and the cell test portions 3 is used to achieve both turn-on and disconnection so as to perform the cell testing on the display panel. The space saving is maximized. The excess processes are deleted. The tact time is reduced.

The connection lines 4 are connected to data lines 7 of the display region 1 of the display panel. The frame 2 of the display panel comprises a first conductive line fan-out region of the data lines 7. Multiple data lines 7 are arranged through the first conductive line fan-out region in a non-parallel form. The distances between the data lines 7 in the first conductive line fan-out region are reduced from the display region 1 of the display panel towards the frame 2 of the display panel. The cell test structure comprises an active switch control line 61 intersecting the connection lines 4. One first shorting bar 5 comprises one cell test portion 3 individually disposed on two ends thereof. The middle portion of the first shorting bar 5 is connected to three connection lines 4. The three connection lines 4 individually comprise one of the active switches 6 disposed at a corresponding position. The three active switches 6 are disposed on one active switch control line 61. The active switch control line 61 comprises two active switch control portions 62 of the active switches 6 disposed on two ends thereof. Two test regions 8 adjacent to each other in a same direction share the same first shorting bar 5. Three cell test portions 3 are disposed in connection with the first shorting bar 5, one is connected to a middle portion of the first shorting bar 5, and the other two are connected to two ends of the first shorting bar 5, respectively. It makes full use of the corresponding structure and optimizes the layout of structure. The active switches 6 have a width of 30 µm. The active switches 6 with small width facilitates the use of the cell test structure on the display panel having the narrow frame 2 or even the ultra-narrow frame 2. It does not take up too much space and facilitates layout. The active switches 6 are thin film transistor. Thin film transistor (TFT) has a wide range of applications and mature technology, and is easy to use. The applicant has considered that when the active switches 6 are not used, laser is used to interrupt the connection between the shorting bar and the lead after the testing is finished. However, the accuracy of the laser cutting is generally about 100 µm. It not only gratuitously adds a laser cutting process, but also wastes space. It is not beneficial for the ultra-narrow frame 2.

FIGS. 1 and 2 are schematic views of the active switches 6 at connection or disconnection state. In this situation, as shown in FIGS. 1 and 2, electric power is supplied through the cell test portions (cell test pads) 3 and transmitted to the connection lines (lead) 4 through traces of the first shorting bar 5. Electric power is finally transmitted to the pixels of the display region 1 through traces of the first conductive line fan-out region. When the cell test lights up, high electric potential is supplied to the TFT pad at the same time through the signal connection between the cell test portions 3 and the control terminal of the active switches 6. At the moment, the voltage can be transmitted to the lead through the shorting bar. When the cell test does not light up, the lead and the shorting bar are disconnected so as to omit the laser cutting process.

Specifically, the cell test structure comprises the active switch control line 61 intersecting the connection lines 4. Multiple active switches 6 are disposed on the active switch control line 61. No matter the active switches 6 are disposed on multiple connection lines 4 to control the connection of the connection lines 4 or not, disposing the active switch control line 61 intersecting the connection lines 4 at the same time facilitates simultaneous work. Complicated settings for separately control single active switch 6 are simplified. Costs are reduced and it is easier for management at the same time. The active switch control line 61 is disposed to be perpendicular to the connection lines 4. The active switch control line 61 comprises an active switch control portion 62 of the active switches 6 disposed on two ends thereof. The active switch control portion 62 disposed on two ends can control turn-on and disconnection of the active switches 6 in real-time and effectively by the external input. The input type is various and more suitable. It is a form controlled through the external. The active switch control portions 62 are pads. Alternatively, the active switch control line 61 is coupled to a driving chip of the display panel. The driving chip is coupled, so turn-on and disconnection of the active switches 6 are controlled by internal signal of the display panel. It is able to use the original electrical components and wiring arrangements, and so on, so as to reduce the structure arrangement of the cell test structure and reduce costs. It is a form controlled through the internal of the display panel. For example, the active switch control line 61 coupled to the driving chip may comprise one active switch 6 disposed thereon. The operation of the active switches 6 disposed on the connection lines 4 is controlled through this active switch 6.

Specifically, the first shorting bar 5 comprises at least two connection portions disposed thereon and connected to the cell test portions 3. In other words, at least two cell test portions 3 are connected to the first shorting bar 5. When the cell test structure is used to test the display panel, the testing is usually partitioned. The cell test portions 3 are pads.

As further still another embodiment of the disclosure, the display panel comprises a cell test structure. The cell test structure is positioned at the frame 2 of the display panel. The cell test structure comprises the cell test portions 3 for supplying electric power to the cell test structure, and multiple connection lines 4 for connecting the conductive lines of the display region 1 of the display panel. The cell test structure also comprises a first shorting bar 5. The first shorting bar 5 is disposed and connected between the cell test portions 3 and the connection lines 4. The cell test structure further comprises multiple active switches 6 disposed on the connection lines 4. The active switches 6 are electrically connected to the cell test portions 3. The active switches 6 are disposed on the connection lines 4, and the electrical connection between the active switches 6 and the cell test portions 3 is used to achieve both turn-on and disconnection so as to perform the cell testing on the display panel. The space saving is maximized. The excess processes are deleted. The tact time is reduced.

The connection lines 4 are connected to scan lines of the display region 1 of the display panel. The frame 2 of the display panel comprises a second conductive line fan-out region of the scan lines. Multiple scan lines are arranged through the second conductive line fan-out region in a non-parallel form. The distances between the scan lines in the second conductive line fan-out region are reduced from the display region 1 of the display panel towards the frame 2 of the display panel. The cell test structure comprises an active switch control line 61 intersecting the connection lines 4. One first shorting bar 5 comprises one cell test portion 3 individually disposed on two ends thereof. The middle portion of the first shorting bar 5 is connected to three connection lines 4. The three connection lines 4 individually comprise one of the active switches 6 disposed at a corresponding position. The three active switches 6 are disposed on one active switch control line 61. The active switch control line 61 comprises two active switch control portions 62 of the active switches 6 disposed on two ends thereof. Two test regions 8 adjacent to each other in a same direction share the same first shorting bar 5. Three cell test portions 3 are disposed in connection with the first shorting bar 5, one is connected to a middle portion of the first shorting bar 5, and the other two are connected to two ends of the first shorting bar 5, respectively. It makes full use of the corresponding structure and optimizes the layout of structure. The active switches 6 have a width of 30 μm. The active switches 6 with small width facilitates the use of the cell test structure on the display panel having the narrow frame 2 or even the ultra-narrow frame 2. It does not take up too much space and facilitates layout. The active switches 6 are thin film transistor. Thin film transistor (TFT) has a wide range of applications and mature technology, and is easy to use. The applicant has considered that when the active switches 6 are not used, laser is used to interrupt the connection between the shorting bar and the lead after the testing is finished. However, the accuracy of the laser cutting is generally about 100 μm. It not only gratuitously adds a laser cutting process, but also wastes space. It is not beneficial for the ultra-narrow frame 2.

FIGS. 1 and 2 are schematic views of the active switches 6 at connection or disconnection state. In this situation, as shown in FIGS. 1 and 2, electric power is supplied through the cell test portions (cell test pads) 3 and transmitted to the connection lines (lead) 4 through traces of the first shorting bar 5. Electric power is finally transmitted to the pixels of the display region 1 through traces of the second conductive line fan-out region. When the cell test lights up, high electric potential is supplied to the TFT pad at the same time through the signal connection between the cell test portions 3 and the control terminal of the active switches 6. At the moment, the voltage can be transmitted to the lead through the shorting bar. When the cell test does not light up, the lead and the shorting bar are disconnected so as to omit the laser cutting process.

Specifically, the cell test structure comprises the active switch control line 61 intersecting the connection lines 4. Multiple active switches 6 are disposed on the active switch control line 61. No matter the active switches 6 are disposed on multiple connection lines 4 to control the connection of the connection lines 4 or not, disposing the active switch control line 61 intersecting the connection lines 4 at the same time facilitates simultaneous work. Complicated settings for separately control single active switch 6 are simplified. Costs are reduced and it is easier for management at the same time. The active switch control line 61 is disposed to be perpendicular to the connection lines 4. The active switch control line 61 comprises an active switch control portion 62 of the active switches 6 disposed on two ends thereof. The active switch control portion 62 disposed on two ends can control turn-on and disconnection of the active switches 6 in real-time and effectively by the external input. The input type is various and more suitable. It is a form controlled through the external. The active switch control portions 62 are pads. Alternatively, the active switch control line 61 is coupled to a driving chip of the display panel. The driving chip is coupled, so turn-on and disconnection of the active switches 6 are controlled by internal signal of the display panel. It is able to use the original electrical components and wiring arrangements, and so on, so as to reduce the structure arrangement of the cell test structure and reduce costs. It is a form controlled through the internal of the display panel. For example, the active switch control line 61 coupled to the driving chip may comprise one active switch 6 disposed thereon. The operation of the active switches 6 disposed on the connection lines 4 is controlled through this active switch 6.

Specifically, the first shorting bar 5 comprises at least two connection portions disposed thereon and connected to the cell test portions 3. In other words, at least two cell test portions 3 are connected to the first shorting bar 5. When the cell test structure is used to test the display panel, the testing is usually partitioned. The cell test portions 3 are pads.

It should be noted that, in the above-mentioned embodiments, the material of the substrate may be glass, plastic, and so on.

In the above-mentioned embodiments, the display panel comprises liquid crystal panel, OLED (Organic Light-Emitting Diode) panel, curved panel, plasma panel, and so on. Taking liquid crystal panel as examples, the liquid crystal panel comprises a Thin Film Transistor Substrate (TFT Substrate) and a Color Filter Substrate (CF Substrate). The TFT Substrate and the CF Substrate are arranged to be opposite. Liquid crystal and spacers (photo spacers, PS) are arranged between the TFT Substrate and the CF Substrate. The TFT Substrate comprises thin film transistors (TFT) disposed thereon. The CF Substrate comprises a color filter layer disposed thereon.

In the above-mentioned embodiments, the CF Substrate may comprise TFT arrays. The color filter and the TFT arrays may be formed on the same substrate. The TFT Substrate may comprise a color filter layer.

In the above-mentioned embodiments, the display panel of the disclosure may be a curved type panel.

The foregoing contents are detailed description of the disclosure in conjunction with specific preferred embodiments and concrete embodiments of the disclosure. The disclosure is not limited to these descriptions. For the person skilled in the art of the disclosure, without departing from the concept of the disclosure, simple deductions or substitutions can be made and should be included in the protection scope of the disclosure.

What is claimed is:

1. A display panel, comprising a cell test structure positioned at a frame of the display panel, wherein the cell test structure comprises:
    three cell test portions for supplying electric power to the cell test structure;
    a plurality of connection lines for connecting conductive lines of a display region of the display panel;
    a first shorting bar, disposed and connected between the cell test portions and the connection lines; and
    a plurality of active switches, disposed on the connection lines, wherein the plurality of active switches are electrically connected to the cell test portions;
    wherein two test regions adjacent to each other in a same direction share the first shorting bar, one of the cell test portions is connected to a middle portion of the first shorting bar, and the other two of the cell test portions are connected to two ends of the first shorting bar, respectively.

2. The display panel as claimed in claim 1, wherein the plurality of active switches have a width of 30 µm.

3. The display panel as claimed in claim 1, wherein the connection lines are connected to data lines of the display region of the display panel, and the frame of the display panel comprises a first conductive line fan-out region of the data lines, and wherein the data lines are arranged through the first conductive line fan-out region in a non-parallel form, and distances between the data lines in the first conductive line fan-out region are reduced from the display region of the display panel towards the frame of the display panel.

4. The display panel as claimed in claim 1, wherein the connection lines are connected to scan lines of the display region of the display panel, and the frame of the display panel comprises a second conductive line fan-out region of the scan lines, and wherein the scan lines are arranged through the second conductive line fan-out region in a non-parallel form, and distances between the scan lines in the second conductive line fan-out region are reduced from the display region of the display panel towards the frame of the display panel.

5. The display panel as claimed in claim 1, wherein the plurality of active switches are thin film transistors.

6. The display panel as claimed in claim 1, wherein the cell test structure comprises an active switch control line intersecting the connection lines, wherein portions of the first shorting bar are connected to three of the connection lines, and the three of the connection lines individually comprise one of the plurality of active switches disposed at a corresponding position, and wherein three of the active switches are disposed on the active switch control line, and the active switch control line comprises two active switch control portions of the plurality of active switches disposed on two ends of the active switch control line.

7. The display panel as claimed in claim 6, wherein the first shorting bar comprises at least two connection portions disposed thereon and connected to the cell test portions.

8. The display panel as claimed in claim 6, wherein the cell test portions are pads.

9. The display panel as claimed in claim 1, wherein the cell test structure comprises an active switch control line intersecting the connection lines, and the plurality of active switches are disposed on the active switch control line.

10. The display panel as claimed in claim 9, wherein the active switch control line comprises an active switch control portion of the plurality of active switches disposed on two ends of the active switch control line.

11. The display panel as claimed in claim 9, wherein the active switch control line is coupled to a driving chip of the display panel.

12. The display panel as claimed in claim 11, wherein the active switch control line coupled to the driving chip comprises a first active switch disposed thereon, and the first active switch controls operation of the plurality of active switches disposed on the connection lines.

13. A display panel, comprising a cell test structure positioned at a frame of the display panel, wherein the cell test structure comprises:
    three cell test portions for supplying electric power to the cell test structure;
    a plurality of connection lines for connecting conductive lines of a display region of the display panel;

a first shorting bar, disposed and connected between the cell test portions and the connection lines; and a plurality of active switches, disposed on the connection lines, wherein the plurality of active switches are electrically connected to the cell test portions, wherein the cell test structure further comprises an active switch control line intersecting the connection lines, and the first shorting bar comprises one of the cell test portions individually disposed on two ends of the first shorting bar, wherein portions of the at least one first shorting bar are connected to three of the connection lines, and the three of the connection lines individually comprise one of the plurality of active switches disposed at a corresponding position, and wherein three of the active switches are disposed on the active switch control line, and the active switch control line comprises two active switch control portions disposed on two ends of the active switch control line, wherein test regions adjacent to each other in a same direction share the first shorting bar, one of the three cell test portions is connected to a middle portion of the first shorting bar, and the other two of the three cell test portions are connected to two ends of the first shorting bar, respectively, and wherein the cell test portions are pads, and wherein the at least one first shorting bar comprises at least two connection portions disposed thereon and connected to the cell test portions.

14. A display panel, comprising a cell test structure positioned at a frame of the display panel, wherein the cell test structure comprises:

cell test portions for supplying electric power to the cell test structure;

a plurality of connection lines for connecting conductive lines of a display region of the display panel;

a first shorting bar, disposed and connected between the cell test portions and the connection lines; and a plurality of active switches, disposed on the connection lines, wherein the plurality of active switches are electrically connected to the cell test portions, wherein the cell test structure further comprises an active switch control line intersecting the connection lines and two active switch control portions respectively disposed on two ends of the active switch control line, and the plurality of active switches are disposed on the active switch control line, wherein the active switch control portions and the cell test portions are pads arranged along a lengthwise direction of the first shorting bar, and the pads are positioned between the first shorting bar and the display region.

15. The display panel as claimed in claim 14, wherein the active switch control line is perpendicular to the connection lines.

16. The display panel as claimed in claim 15, wherein the plurality of active switches are thin film transistors.

17. The display panel as claimed in claim 16, wherein the plurality of active switches are positioned between the two active switch control portions.

18. The display panel as claimed in claim 17, wherein the plurality of active switches and the two active switch control portions are positioned between two of the cell test portions.

19. The display panel as claimed in claim 17, wherein the plurality of active switches, the active switch control line, and the two active switch control portions are positioned between two adjacent cell test portions.

20. The display panel as claimed in claim 17, wherein the connection lines are connected to middle portions of the first shorting bar.

* * * * *